United States Patent [19]

Young

[11] Patent Number: 5,621,683
[45] Date of Patent: Apr. 15, 1997

[54] SEMICONDUCTOR MEMORY WITH NON-VOLATILE MEMORY TRANSISTOR

[75] Inventor: Nigel D. Young, Redhill, England

[73] Assignee: U.S. Philips Corporation, New York, N.Y.

[21] Appl. No.: 567,250

[22] Filed: Dec. 5, 1995

[30] Foreign Application Priority Data

Dec. 6, 1994 [GB] United Kingdom .................... 9424598

[51] Int. Cl.$^6$ .................................................... G11C 7/00
[52] U.S. Cl. ................................. 365/185.05; 365/185.26
[58] Field of Search ........................ 365/185.01, 185.05, 365/185.26; 257/318, 320, 316

[56] References Cited

U.S. PATENT DOCUMENTS

| | | | |
|---|---|---|---|
| 4,586,065 | 4/1986 | Neukomm | 357/23.5 |
| 5,272,370 | 12/1993 | French | 257/353 |
| 5,331,592 | 7/1994 | Yamagata | 365/185.26 |
| 5,394,359 | 2/1995 | Kowalski | 365/185.05 |
| 5,440,159 | 8/1995 | Larsen et al. | 365/185.05 |
| 5,469,381 | 11/1995 | Yamazaki | 365/185.01 |

FOREIGN PATENT DOCUMENTS

| | | | |
|---|---|---|---|
| 0408129A2 | 1/1991 | European Pat. Off. | H01L 29/784 |
| 0520561A2 | 12/1992 | European Pat. Off. | G11C 11/14 |
| 60-38799 | 2/1985 | Japan | G11C 17/00 |

OTHER PUBLICATIONS

"Electronic Properties of a-SiNx:H Thin Film Diodes", by J.M. Shannon et al, Philips Research Laboratories, Mat. Res. Soc. Symp. Proc. vol. 297, 1993, pp. 987–992.

"Characterisation of Low Temperature Poly–Si Thin Film Transistors", by S.D. Brotherton et al, Philips Research Lab., Solid–State Electr., vol. 34, No. 7, pp. 671–679.

Primary Examiner—Son T. Dinh

[57] ABSTRACT

With a semiconductor memory cell (particularly but not exclusively in a thin-film device) having a non-volatile memory transistor (Tm) as a driver transistor, an adequate difference in output signal (I) can be derived from the cell for the different states of the memory transistor (in spite of poor transistor characteristics,) thereby permitting the assembly of a large number of such memory cells in an array (100). Each memory cell includes a load (Tl) driven by the non-volatile memory transistor (Tm). In the different memory states of the memory transistor (Tm) a difference in signal occurs at a node (30) between the memory transistor (Tm) and the load (Tl). Each cell also includes a switch (To) which is coupled to the node (30) and switched from one output state to another by the signal at the node (30). The output state of the switch (To) provides the output signal (I) from the cell. Such an arrangement permits the memory transistor (Tm) and the output switch (To) to be optimized for their respective memory function and output function. The memory transistor may be of the dielectric-storage type (MNOST) or of the floating-gate type. In a thin-film circuit memory, the output switch may be a thin-film transistor (To) or a thin-film diode.

10 Claims, 4 Drawing Sheets

SEMICONDUCTOR MEMORY WITH NON-VOLATILE MEMORY TRANSISTOR

BACKGROUND OF THE INVENTION

This invention relates to semiconductor memories comprising a plurality of memory cells each including a non-volatile memory transistor. The semiconductor memory may be part of a monolithic semiconductor device formed in, for example, monocrystalline silicon. However the invention is particularly advantageous for forming the memory in thin-film circuitry on an insulating substrate as part of a larger area electronic device which also includes other thin-film circuitry on the insulating substrate. The other thin-film circuitry may perform a logic-function and/or may comprise an active-matrix liquid-crystal display or other flat panel display and/or an image sensor.

It is known to form semiconductor memories with non-volatile memory transistors, such as floating-gate transistors and dielectric-storage transistors. The memory state of a memory cell comprising a floating-gate transistor is determined by the charge state of a floating, additional gate electrode between the main gate and conduction channel of the transistor. The memory state of a memory cell comprising a dielectric-storage transistor is determined by the charge state at a storage site in the gate dielectric of the transistor. Normally the non-volatile memory transistor of a memory cell forms the memory storage element which is addressed by an individual selection transistor within that cell. Such a transistor arrangement for a memory cell is disclosed in, for example, FIGS. 7 and 13 to 16 of U.S. Pat. No. 4,586,065, the whole contents of which are hereby incorporated herein as reference material. In U.S. Pat. No. 4,586,065 the memory transistor is of the dielectric-storage type (for example the MNOS type having storage sites between layers of silicon nitride and of silicon oxide which form its gate dielectric) and has an advantageous specific geometry for its gate dielectric.

Japanese Patent Application Kokai JP-A-60-38799 discloses a less conventional arrangement of a non-volatile memory transistor in a memory cell. In this case, the memory cell includes a load driven by the non-volatile memory transistor. The whole contents of JP-A-60-38799 are hereby incorporated herein as reference material. The memory transistor has a conduction channel which is conductive in a first memory state of the memory transistor and which is less conductive in a second memory state of the memory transistor so as to provide a difference in signal at a node between the memory transistor and the load. The signal at this node is the output signal of this known memory cell. The memory transistor is of the floating-gate type. As illustrated in FIG. 4 of JP-A-60-38799, the transistor characteristics of the floating-gate memory transistor are not good enough to provide an adequate difference in the signal at the node between the memory transistor and the load, in the first and second memory states of the cell. Both a non-symmetric gate geometry and a particular circuit connection are adopted for this memory transistor of JP-A-60-38799, in order to obtain a sufficiently large difference in signal at the node between the memory transistor and the load, in the first and second memory state of the cell. Thus, the floating gate is localized so as to control the conduction channel adjacent the drain end of the transistor, but not adjacent to its source end. The drain is set to ground potential. The load is driven with the source of the memory transistor. Such a floating-gate memory transistor having this asymmetric gate geometry is not ideal for forming a low cost memory.

The memories disclosed in U.S. Pat. No. 4,586,065 and JP-A-60-38799 are of the monolithic semiconductor type which are usually formed in monocrystalline silicon. There is currently much interest in developing much larger area electronic devices using thin-film circuitry with, for example, amorphous or polycrystalline semiconductor films, on glass and on other inexpensive insulating substrates. U.S. Pat. No. 5,272,370 discloses one example of a thin-film memory device. The whole contents of U.S. Pat. No. 5,272,370 are hereby incorporated herein as reference material. In this case, the memory device is of the ROM type (read only memory), comprising thin-film diodes as the memory elements. There is a need for thin-film read-write memory devices comprising non-volatile memory transistors. Floating-gate and dielectric-storage memory transistors can be formed as thin-film devices, but their transistor characteristics are much worse than those for similar transistors formed in monocrystalline silicon. In particular, thin-film memory transistors have higher off-state leakage currents and poorer (i.e leakier) sub-threshold characteristics, both of which render more difficult the assembly of large numbers of such memory cells in a memory array.

SUMMARY OF THE INVENTION

It is an aim of the present invention to provide a semiconductor memory cell (particularly but not exclusively in a thin-film memory device) comprising a non-volatile memory transistor as a driver transistor and having an adequate difference in output signal from the cell for the different states of the memory transistor (in spite of poor transistor characteristics of the memory transistor) to permit the assembly of a large number of such memory cells in an array.

According to the present invention there is provided a semiconductor memory comprising a plurality of memory cells each including a load driven by a non-volatile memory transistor, the memory transistor having a conduction channel which is conductive in a first memory state of the memory transistor and which is less conductive in a second memory state of the memory transistor so as to provide a difference in signal at a node between the memory transistor and the load. In accordance with the present invention such a memory is characterized in that each cell also includes a switch coupled to the node and switched from one output state to another by the signal at the node, and in that the output state of the switch provides an output signal from the cell.

Such an arrangement in accordance with the present invention permits the memory transistor and the output switch to be optimized for their respective memory function and output function, so that poor driver characteristics of the memory transistor can be overcome by means of the switch which provides the output signal from the cell. A non-symmetric and complex gate geometry such as that disclosed in JP-A-60-38799 is not needed, and a useful number of memory cells can be assembled in a memory array even with the poor transistor characteristics of a thin-film memory transistor. Although the present invention may be used for monolithic semiconductor memories, it is particularly advantageous with the poorer transistor characteristics of thin-film transistors in thin-film semiconductor memories.

A variety of semiconductor devices may be used to form the switch coupled to the node between the memory transistor and the load. In thin-film circuitry there are several suitable threshold devices which turn on when the applied voltage exceeds a threshold value. The particular device chosen to form the switch has its threshold value at a level between the different signals which occur at the said node in the different memory states. In a simple form, such a threshold device may be a thin-film diode. However, a transistor is more advantageously used as the threshold device, so that better isolation and a degree of amplification can be achieved between the memory transistor and the output of the cell. Thus, the switch in each cell advantageously comprises an output transistor having a control electrode coupled to the node between the memory transistor and the load. Both the memory transistor and the output transistor may be thin-film field effect transistors.

The memory cell may be accessed by four lines. Thus the memory cell may comprise first and second supply lines, a read/write line and an output line. The memory transistor and its load may be connected between the first and second supply lines. The switch may comprise an output transistor in the form of a field-effect transistor having a gate electrode coupled to the node between the memory transistor and the load. Source electrodes of the memory transistor and of the output transistor may be coupled to the first supply line. A gate electrode of the memory transistor may be coupled to the read/write line, and a drain electrode of the output transistor may be coupled to the output line of the cell.

The present invention may be used with floating-gate transistors as the non-volatile memory transistors. However the fabrication of a floating-gate memory transistor usually requires a device technology providing two levels of gate metallization. These two levels can add to the cost and complexity in the manufacture of the memory, if two such levels are not already needed for another part of the electronic device. Therefore, preferably, the memory transistor is of the dielectric-storage type and so comprises a charge storage region in a gate dielectric between a gate electrode and the conduction channel. Such a memory transistor can be fabricated at low cost in thin-film technology. It may have two different dielectric layers (for example silicon nitride and silicon oxide) between the gate electrode and the conduction channel. However with thin-film device technology, it is even possible to provide a single dielectric layer (for example plasma-enhanced chemical vapour deposited (PE-CVD) silicon nitride) to trap and retain the charge and so form the charge storage region.

In order to simplify the manufacture of the memory in thin-film device technology, the output transistor may be an enhancement field-effect transistor, and the memory transistor and output transistor may be n-channel field-effect transistors. Similarly, the load may be an enhancement field-effect transistor. In order to reduce the number of lines accessing the memory cell, this load transistor may have both its gate and drain electrodes coupled to a power supply line. However, other forms of load device may be used as convenient for the manufacturing technology and for the device characteristics within memory cell.

BRIEF DESCRIPTION OF THE DRAWING

These and other features of the present invention, and their advantages, are illustrated specifically in embodiments of the invention now to be described, by way of example, with reference to the accompanying diagrammatic drawing, in which.

Figure 2:
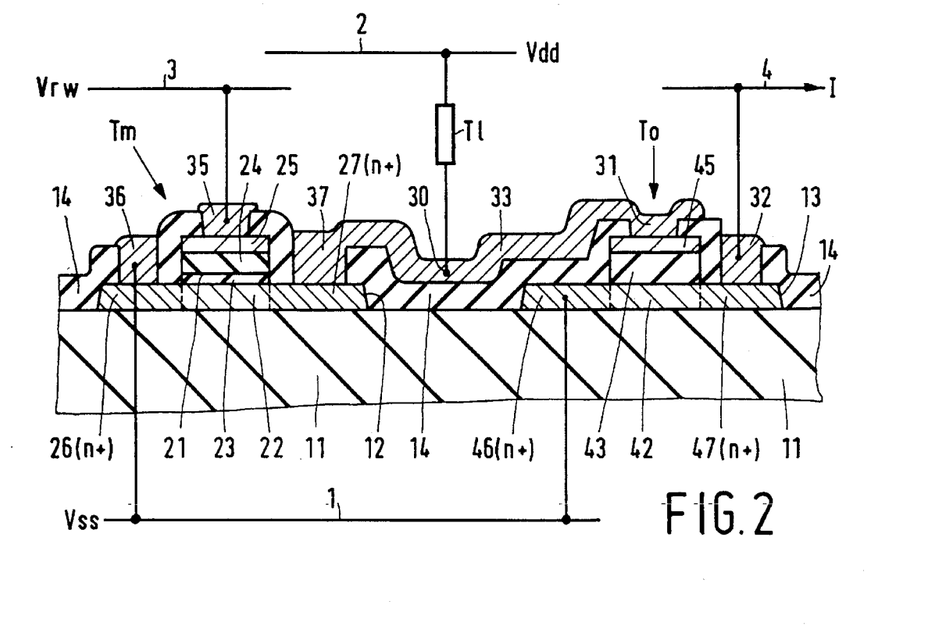
FIG. 2 is a cross sectional view through a memory transistor and output transistor of a particular example of a memory cell for the memory of FIG. 1.
Figure 3:
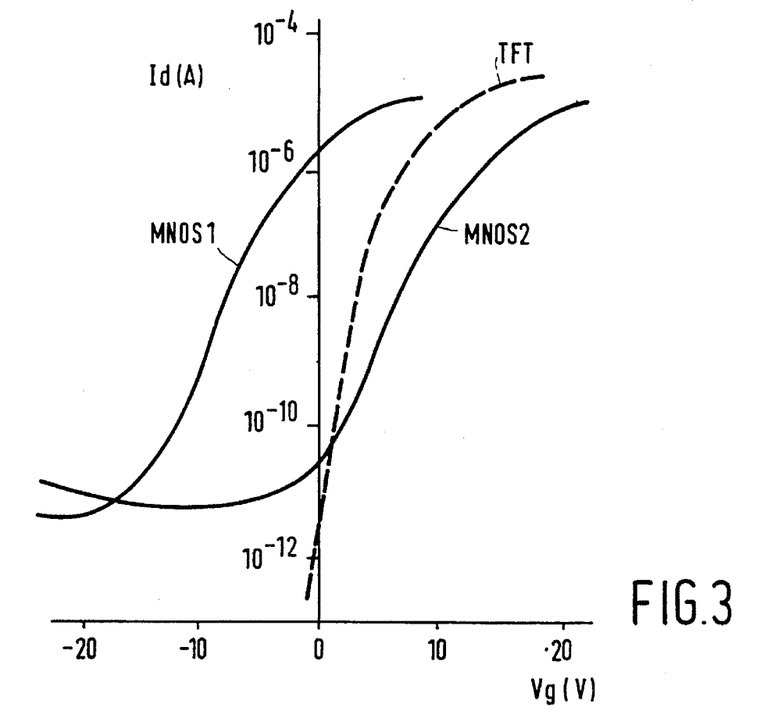
FIG. 3 is a plot of drain current Id in amperes against gate voltage Vg in volts for a memory transistor of the type illustrated in FIG. 2.
Figure 4:
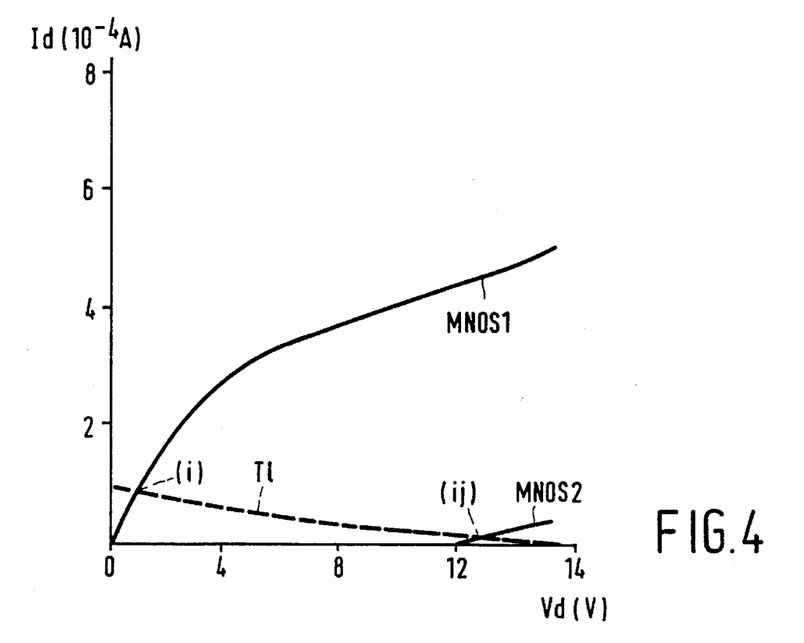
FIG. 4 is a plot of drain current Id in amperes against drain voltage Vd in volts for the memory transistor of FIG. 3, and showing the load line of the load transistor in the circuit configuration of FIG. 6.
Figure 5:
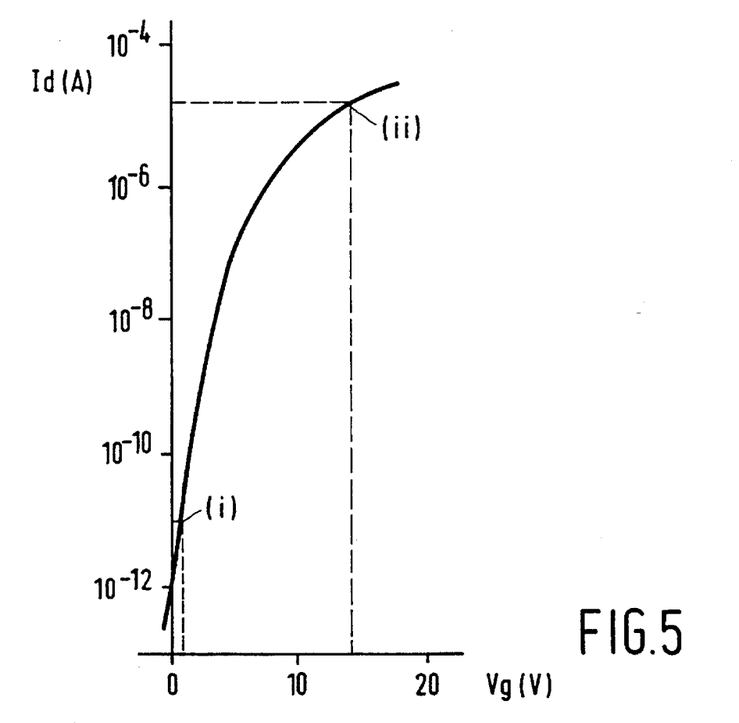
FIG. 5 is a plot of drain current Id in amperes against gate voltage Vg in volts for an output transistor of the type illustrated in FIG. 2.

It should be noted that, except for FIGS. 3, 4 and 5, all the drawings are diagrammatic and not drawn to scale. Especially in the cross sectional view of FIG. 2, relative dimensions and proportions of the various parts have been exaggerated or reduced in size for the sake of clarity and convenience in the drawing. The same reference signs are generally used to refer to corresponding or similar features in the different embodiments.

DESCRIPTION OF THE PREFERRED EMBODIMENTS

Figure 1:
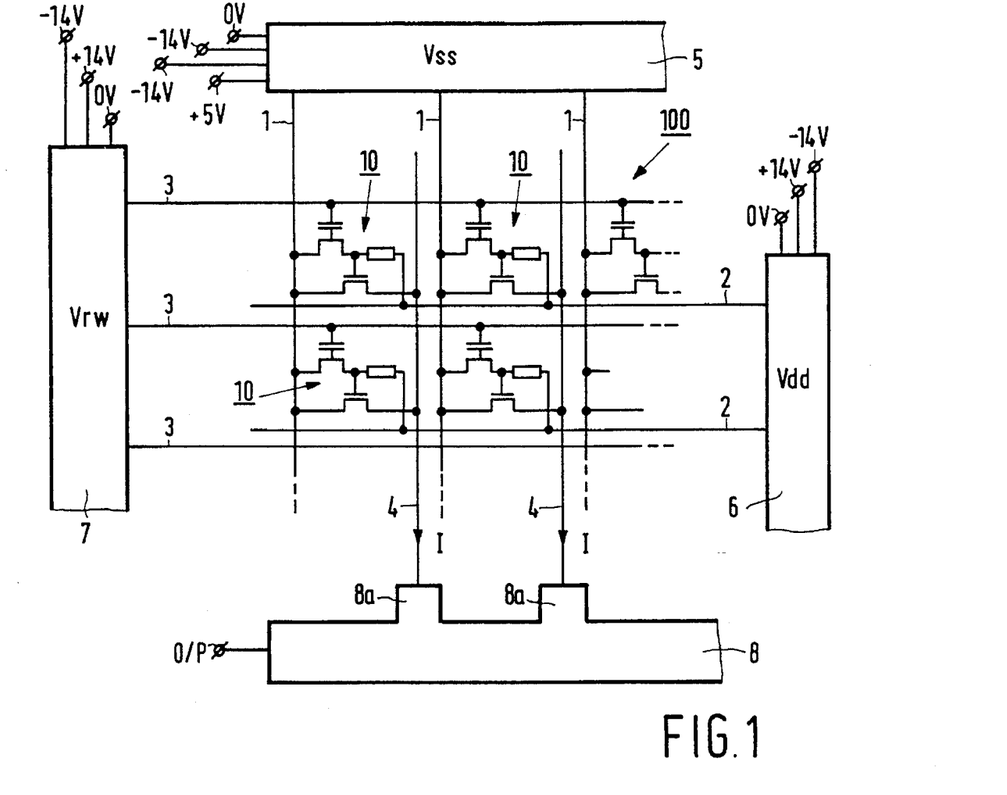
FIG. 1 is a block circuit diagram of a semiconductor memory in accordance with the present invention.

The semiconductor memory of FIG. 1 is suitable for integration in thin-film circuitry on an insulating substrate 11 as illustrated in FIG. 2. The memory comprises an array 100 of memory cells 10, of which only four complete cells are illustrated in FIG. 1 for the sake of clarity and convenience in the drawing. Each memory cell 10 is accessed via four lines 1 to 4. The lines 1 to 3 are connected to respective addressing circuits 5 to 7. The line 4 is an output line from the cell and is connected to an output circuit 8. In the forms illustrated in FIG. 1, FIG. 2, FIG. 5 and FIG. 6 each cell comprises a memory transistor Tm, a load transistor Tl, and an output transistor To. All three transistors are field-effect transistors, and particularly thin-film field-effect transistors (TFTs) in the example illustrated in FIG. 2. The load transistor Tl is driven in an inverter configuration by the memory transistor Tm. Both Tm and Tl are connected between the lines 1 and 2 which serve as first and second supply lines for the inverter. The memory transistor Tm is of the non-volatile dielectric-storage type having a charge-storage region 21 in its gate dielectric. In the form illustrated in FIGS. 2 to 6, the transistors Tm, Tl, and To are n-channel enhancement transistors, and so the current flow through each transistor is by electrons in its conduction channel under the control of its gate electrode.

The memory transistor Tm has different memory states corresponding to different charge states of the charge storage region 21. In the first memory state with hole-storage in the charge-storage region 21, the conduction channel 22 of Tm is conductive. In a second memory state with the charge storage region 21 uncharged, the conduction channel 22 is less conductive. There is thus a difference in signal at the node 30 between Tm and Tl depending on the memory state of Tm. The output transistor To has its gate electrode 45 coupled to the node 30 between the memory transistor Tm and the load Tl. FIG. 2 shows this connection between 30 and 45 in the form of a thin-film conductor track 33. Source electrodes 26 and 46 respectively of the memory transistor Tm and of the output transistor To are coupled to the first supply line 1. The gate electrode 25 of the memory transistor Tm is coupled to the read/write line 3. The drain electrode 47 of the output transistor To is coupled to the output line 4 of the cell. Thus, the output state of the transistor To provides the output signal from the cell.

The output transistor To of FIG. 2 is a typical n-channel enhancement thin-film field-effect transistor. A typical Id-Vg characteristic for such an n-channel TFT is shown by the broken line TFT in FIG. 3 and by the plot in FIG. 5. The Id-Vg characteristics of the memory transistor Tm in its first and second memory states are shown by the plots MNOS1 and MNOS2 respectively in FIG. 3. All the Id-Vg characteristics in FIG. 3 were plotted with a drain voltage Vd of 0.1 volts. From a comparison of the lines in FIG. 3, it can be seen that the non-volatile memory TFT Tm has a much poorer sub-threshold slope to its Id-Vg characteristic than does a conventional TFT such as To. This sub-threshold slope is also very much worse than that of a monolithic field-effect transistor. Thus, polycrystalline silicon material of the conduction channel 22 of the TFT Tm has a high density of trapping states distributed through its band gap. These trapping states have a significant effect on the sub-threshold voltage characteristic of Tm as illustrated in FIG. 3, because the surface charge induced in the conduction channel 22 by the memory charge state of Tm is partitioned between these trapping states and the formation of free carriers in the channel. Such a dominant effect of the trapping states is not present in monocrystalline silicon field-effect transistors.

The sub-threshold slope of the thin-film memory transistor Tm is so poor that it cannot be used satisfactorily as a storage element with an addressing transistor in a cell configuration such as that disclosed in U.S. Pat. No. 4,586,065. Furthermore, when the transistor Tm is used in an inverter configuration with a load Tl as in FIGS. 1, 2, 4 and 6, there is such a high leakage current in the less conductive state of the conduction channel 22 (in the erased, second memory state) that an adequate difference in signal from the node 30 of the inverter cannot be obtained on a common line to which any reasonably large number of cells 10 may be connected in the memory array. This leakage is much worse than that occurring with monolithic field-effect transistors Tm and Tl such as illustrated in JP-A-60-38799 with reference to its FIG. 4.

In accordance with the present invention the output signal of the cell 10 is taken as a current I on the line 4 from the drain electrode 47 of the output transistor To of the cell, instead of being taken from the node 30. By this means, a more acceptable difference in output signal can be obtained, and adverse effects of poor transistor characteristics can be avoided. A specific example is illustrated in the plots of FIGS. 3 to 5 which were measured for specific TFT structures described below with reference to FIG. 2.

The differences in current and voltage occurring at the node 30 between the memory driver Tm and its load Tl are given by the two points (i) and (ii) in FIG. 4 at the intersection of the load line Tl with the two driver transistor characteristics MNOS1 and MNOS2 which correspond to the respective first and second memory states Tm. These plots of FIG. 4 were made with 14 volts applied to the Vdd power supply line 2 of the inverter circuit Tm,Tl and with 0 (zero) volts applied to the Vrw read/write line 3 of the gate 25 of Tm. In this example of FIG. 4, the points (i) and (ii) are at about 0.8 volts and about 12.8 volts respectively.

The node 30 of the inverter Tm,Tl is connected to the gate 45 of the output transistor To, and so the Id-Vg characteristic of FIG. 5 shows these points (i) and (ii) as applied gate voltages Vg. The output current I from the cell 10 is the drain current Id of TFT Tl at these two points (i) and (ii), i.e about $10^{-11}$ amps when Tm is the first memory state (hole-storage in region 21) and about $10^{-5}$ amps when Tm is in the second (erased) state. There is therefore about 6 orders of magnitude difference in the current signal I from this memory cell 10 in accordance with the invention.

If by contrast the cell output is taken directly from the node 30 (i.e without the inclusion of an output transistor To in accordance with the present), then the output signal is a voltage applied to the line 4. The difference in output signal from the addressed cell 10 in this case would be the difference between 0.8 volts and 12.8 volts at the points (i) and (ii) in FIG. 4. However, the usefulness of this voltage difference in charging the output line 4 is lost in this case, because of the high leakage current of the other (non-addressed) cells 10 connected to the same output line.

If this memory TFT Tm having an Id-Vg characteristic of FIG. 3 were to be used, in another arrangement also not in accordance with the invention, as a storage element addressed by a selection transistor within the cell (i.e similar to the cell circuit configuration of U.S. Pat. No. 4,586,065, and so not as the driver of an inverter Tm,Tl), then the output current I from Tm would be given by the drain current Id in FIG. 3. Although the difference in output current I (Id) for the two memory states (curves MNOS1 and MNOS2) with 0 (zero) volts on the gate 25 is quite large (from about $2 \times 10^{-6}$ to $2 \times 10^{-11}$ amps), its usefulness is lost, because of the high leakage current of the other (non-addressed) cells 10 connected to the same output line.

The memory circuit of FIGS. 1, 2 and 5 constructed in accordance with the present invention is operated as follows:

A particular cell 10 which is to be programmed or read is addressed from the circuits 5 to 7 by signals on its own lines 1 to 3, while the other lines 1 to 3 of the memory array are held in the stand-by condition at, for example, zero volts.

When writing (i.e. programming) a memory cell, a high voltage is applied between the source electrode 26 and the gate electrode 25 of the memory transistor Tm which is being programmed. Either no voltage or a smaller voltage is present between the source electrode 26 and the gate electrode 25 of the other memory transistors Tm which are not being programmed. A specific example for the n-channel TFT technology of FIG. 2 involves applying the following signals on the lines 1 to 3:

+14 V on the addressed cell line 1
0 V on all other column lines 1
−14 V on the addressed cell line 3
0 V on all other read/write lines 3
+14 V on the addressed cell line 4
0 V on all other output lines 4
+14 V on the addressed cell line 2
0 V on all other supply lines 2

When erasing the programmed memory state of one memory cell, a high voltage of opposite polarity is applied between the source electrode 26 and the gate electrode 25. The following signals may be applied in the specific example:

```
    −14 V on the addressed cell line 1
     0 V on all other column lines 1
    +14 V on the addressed cell line 3
     0 V on all other read/write lines 3
    −14 V on the addressed cell line 4
     0 V on all other output lines 4
     0 V on all the supply lines 2
```

When erasing the whole array of memory cells, the high voltage (but of the opposite polarity) is applied between the source electrode 26 and the gate electrode 25 of all the memory transistors Tm. The following signals may be applied in the specific example:

```
    −14 V on all column lines 1
    +14 V on all the read/write lines 3
    −14 V on all the supply lines 2 and all the output lines 4
```

The +14V and −14V bias levels are applied to the output lines 4 in order to provide a symmetrical bias situation on the various lines of the cells. Although this situation is currently preferred, other arrangements are possible. Thus, when writing or erasing memory cells, all the output lines 4 may be at a floating potential or they may be grounded at 0V.

When reading a memory cell, its transistors Tm and Tl are operated as an inverter circuit with 0V on the gate of Tm. For this purpose a potential difference (Vdd−Vss) is applied across the transistors Tm and Tl of that cell. If the same signal Vss is applied to all the column lines 1 of the array, all the memory cells of a given row corresponding to a given line 2 can be read out simultaneously. Alternatively, only one cell of the row may be read out by applying to the other cells of the row the same signal on their column lines 1 as on the row line 2. In the specific example, the following signals may be applied on the lines 1 to 3 for read out from only one cell of a row.

```
    +14 V on the addressed supply line 2
     0 V on all other row lines 2
    +5 V on the addressed cell line 1
     0 V on all other column lines 1
     0 V on the read/write lines 3
```

The output signal from the addressed cell 10 is in the form of a current I on the output line 4. The output circuit 8 may comprise an individual virtual-earth amplifier and/or charge-integrator circuit 8a for each of the output lines 4. In this manner the output current I of an individual memory cell 10 is integrated and converted to a voltage. The individual output voltages from sequentially read cells 10 in each row may then be output at the output O/P of the circuit 8. However, other known types of output circuit 8 may be used to convert the current/charge on an output line 4 to a valid output signal as required in the overall device.

The cell-addressing circuits 5 to 7 may also be constructed in a variety of known circuit types which are able to apply a voltage pulse of desired magnitude to the selected line 1, 2 or 3 connected to that circuit 5, 6 or 7, while maintaining all the non-selected lines 1, 2 or 3 at a fixed potential. Thus, each circuit 5 to 7 may comprise a decoder which may be formed of NOR gates or NAND gates and which may have an N bit input and a $2^N$ bit output. Each combination of input codes to the decoder selects (i.e enables) only one of the lines addressed by that circuit.

The semiconductor memory of FIGS. 1 to 5 may be manufactured using known thin-film circuit technology.

Thus, the transistors Tm, Tl and To of the memory cells 10 as well as TFTs of the addressing circuits 5 to 7 and the output circuit 8 may be fabricated with polycrystalline silicon TFT technology, for example as described in published European Patent Application EP-A-0408129 (Our reference PHB 33571) and the paper "Characterisation of Low Temperature Poly-silicon Thin-Film Transistors" by S D Brotherton et al in Solid State Electronics, Vol 34, No 7, pp 671–679 (1991). The whole contents of EP-A-0408129 and this Solid State Electronics paper are hereby incorporated herein as reference material. Thus, the transistors Tm and To may comprise separate islands 12 and 13 respectively of a patterned polycrystalline silicon film on a low-cost substrate 11 of, for example, a glass or a polymer.

Insulating films are deposited on the silicon islands 12 and 13 by a chemical vapour deposition process and are patterned by etching to form the gate dielectric layers 23, 24, 43 of the transistors. In the form shown in FIG. 2, the gate dielectric 43 of the output transistor To may be of silicon dioxide having a thickness of, for example, about 0.1 µm (micrometers). An etch-stop mask film can be provided in known manner over the silicon dioxide gate dielectric 43 before depositing and patterning the dielectrics 23 and 24. The dielectrics 23 and 24 of Tm may be respectively silicon dioxide having a thickness of, for example, 5 nm (nanometers) and silicon nitride having a thickness of, for example, 0.1 µm. The gate electrodes 25 and 45 may be formed from a further polycrystalline silicon film.

Ion implantation of a dopant such as phosphorous may be used to dope these gate electrodes 35 and 45 and to form doped source and drain regions 26, 27, 46, 47. The channel regions 22 and 42 of the transistors are masked against this source and drain doping. Thus, the regions 22 and 42 may remain as undoped regions of the polycrystalline silicon islands 12 and 13, apart from any dopant implant to adjust the threshold voltage of the TFT in known manner. After depositing and patterning an insulating film 14, a metal film (for example of aluminium) may be deposited and patterned to form the various connections and interconnections (such as 31 to 33 and 35 to 37 as illustrated in FIG. 2).

Although not shown in FIG. 2, the load TFT Tl may be similar to the output TFT To, but with the gate (45) of Tl connected to the drain (47) of Tl. A part of the connection track 33 of FIG. 2 may contact the source of the load transistor Tl. The drain of the transistor Tl is connected to the line 2.

The plots of FIGS. 3 to 5 were measured for specific examples of these TFT structures of FIG. 2 in which the transistors Tm, To and Tl had the following dimensions:

| Output Transistor To | |
|---|---|
| Thickness of silicon oxide 43 | 0.1 µm |
| Length of channel 42 | 6 µm |
| Width of channel 42 | 50 µm |
| Load Transistor Tl | |
| Thickness of silicon oxide (c.f 43) | 0.1 µm |
| Length of channel (c.f 42) | 6 µm |
| Width of channel (c.f 42) | 10 µm |
| Memory Transistor Tm | |
| Thickness of silicon oxide 23 | 5 nm |
| Thickness of silicon nitride 24 | 0.1 µm |
| Length of channel 22 | 6 µm |
| Width of channel 22 (FIG. 4) | 100 µm |
| Width of channel 22 (FIG. 3) | 50 µm |

In the memory cell 10 itself, the width of the channel 22 of Tm was 100 µm, i.e the inverter circuit characteristic of FIG. 4. However, for the sake of comparison with the Id-Vg characteristic of a typical n-channel enhancement TFT such as To, a transistor Tm having a channel 22 of comparable width (50 μm) was measured for the plots of FIG. 3.

With the double dielectric layer 23, 24 illustrated in FIG. 2, the charge-storage region of the memory transistor Tm is at the interface of the layers 23 and 24. When a silicon nitride upper layer 24 is used, the silicon nitride composition is generally non-stoichiometric SiNx, and the stored charge is actually trapped in the silicon nitride 24. The oxide layer 23 aids its retention by inhibiting a return flow of the charge across the layer 23. It is found that, when the layer 24 is of silicon nitride formed by a low temperature PE-CVD process, then the silicon oxide film 23 can be omitted so simplifying the manufacturing process. It is found that such a silicon nitride film 24 can have sufficient charge-retention at trapping states within itself that it is able to act as the charge-storage region for the memory transistor Tm. The non-stoichiometric silicon nitride may be silicon-rich, with an atomic ratio of silicon to nitrogen in the range of, for example, 0.85 to 1.1

Figure 6:
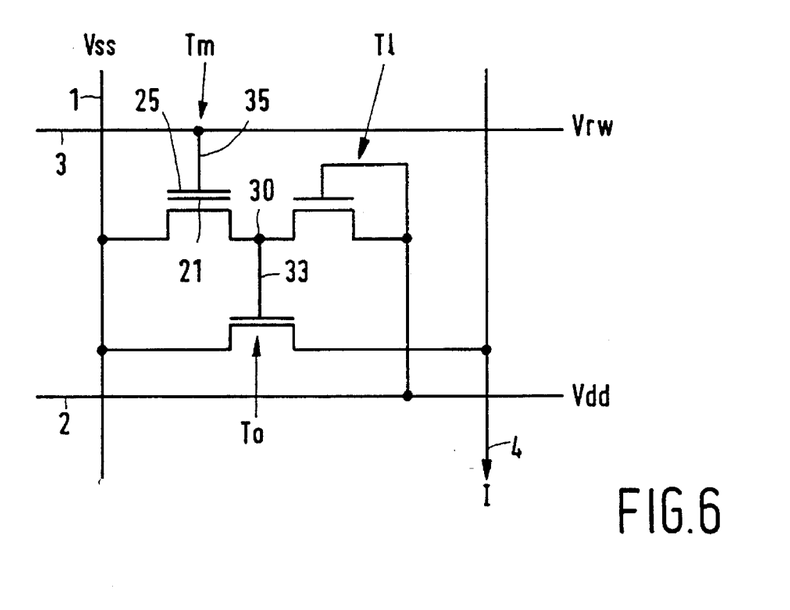
FIG. 6 is a circuit diagram of one embodiment of the memory cell of FIG. 2, and having an enhancement field-effect transistor as a load.

The load transistor TI of FIG. 5 is an enhancement TFT having an undoped conduction channel. FIG. 6 illustrates a modification of the memory cell 10 in which the load transistor TI is a depletion TFT having a drain electrode coupled to the power supply line 2 and having gate and source electrodes coupled to the drain electrode 27 of the memory transistor Tm via the node 30. In this case an additional doping step is required to dope the conduction channel of the load transistor TI. The load line of such a depletion TFT TI is more advantageous in providing a larger difference in signal at the node 30, between the first and second memory states of the memory transistor Tm. However, in most memories, the larger signal difference at the node 30 resulting from using a depletion load transistor TI is not necessary, because of the switched output function of the output transistor To provided in accordance with the present invention.

Figure 7:
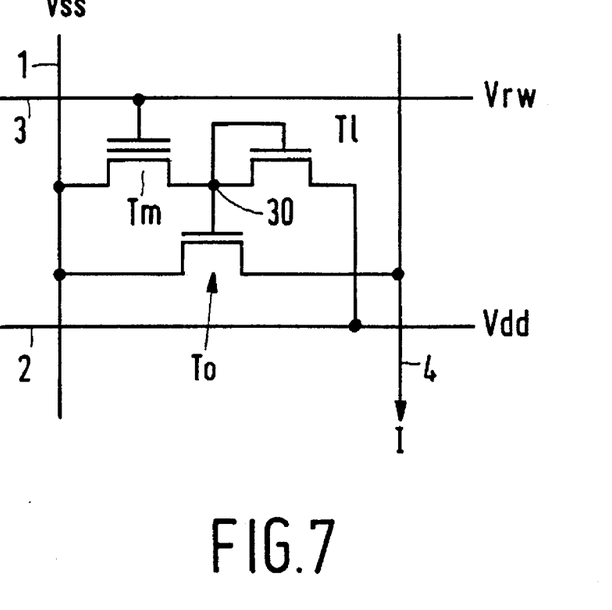
FIG. 7 is a circuit diagram of another embodiment of the memory cell of FIG. 2, and having a depletion field-effect transistor as a load.
Figure 8:
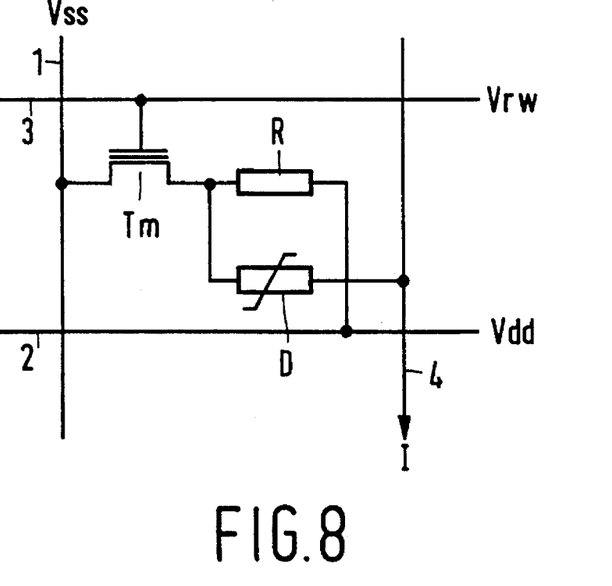
FIG. 8 is a circuit diagram of a modified form of memory cell having a resistor as a load and having a threshold diode as an output switch.

Other types of load TI may be used, for example a polycrystalline silicon resistor or a doped amorphous silicon resistor. A resistive load of this type is illustrated in the modified cell of FIG. 7, with the designation R. A further modification illustrated in FIG. 7 is the use of a threshold diode D as the output switch from the cell 10, instead of a transistor TI. This output switch D may be a thin-film diode. Such a thin-film diode may be a Schottky diode in which a metal-based film forms a Schottky barrier with an intrinsic semiconductor film of, for example, polycrystalline silicon or amorphous silicon. In one specific example such a Schottky diode may be of the MIN type, having a highly-doped n-type silicon film forming the cathode electrode of the diode. Such Schottky diodes are described in, for example, the said U.S. Pat. No. 5,272,370 (in the context of a thin-film ROM). In another form, the thin-film threshold diode D may be based on nitrogen-doped hydrogenated amorphous silicon material as described in, for example, the paper "Electronic Properties of A-SiNx:H Thin-Film Diodes" by J M Shannon et al published in Materials Research Society Symposium Proceedings, Vol 297 (1993), pages 987 to 992, the whole contents of which are hereby incorporated herein as reference material. Thin-film diodes based on such technologies may already be present in a large-area electronic device in the some other part of the thin-film circuitry of the device.

A disadvantage of a diode output from the memory cell 10 is that the output current I from the switch D is drawn in this case through the inverter Tm and R. By contrast, the output current I from the transistor switches To in FIGS. 5 and 6 is drawn directly from the power supply line 1 through the main conduction channel of the transistor To.

In the memory cells 10 of FIGS. 5 and 6, all the transistors Tm, TI and To are of the same conductivity type, i.e they are n-channel devices in which the current flow through the conduction channel is by electrons. Instead of n-channel TFTs, the memory cells 10 may be fabricated with p-channel TFTs having p-type source and drain regions 26, 27, 46, 47 etc; in this case, electrons (instead of holes) are stored in the charge-storage region 21 of the MNOS-TFT Tm. It is also possible to use complementary-type TFTs in the memory cell. Thus, for example, the memory transistor Tm may be n-channel, whereas the load transistor TI may be p-channel with appropriately different circuit bias connections.

The semiconductor memories formed in accordance with the embodiments of FIGS. 1 to 8 may form part of a large area electronic device which also comprises other thin-film circuitry on the insulating substrate 11. Such a device may comprise logic gates formed by thin-film circuitry connected to the memory array 100 and its addressing circuits 5 to 7. In addition to the memory array 100, the device substrate 11 may comprise a small active-matrix liquid-crystal display array, for example constructed with thin-film circuit elements as described in U.S. Pat. No. 5,130,829. The whole contents of U.S. Pat. No. 5,130,829 are hereby incorporated herein as reference material.

Although ion-implanted co-planar polycrystalline silicon TFT structures are illustrated in FIG. 2, other thin-film transistor technologies may be used to fabricate Tm, To and TI. Thus, for example staggered or inverted staggered TFT technologies may be used, in which the doped source and drain electrodes are formed by doped semiconductor films deposited before or after depositing the film 12 and 13 which provides the TFT channel 22 or 42.

Although it is advantageous to use the present invention to compensate for the poor transistor characteristics of thin-film memory transistors Tm, the memory and cells of FIGS. 1, 5, 6 and 7 may be fabricated in monocrystalline silicon, as monolithic memory devices.

From reading the present disclosure, other variations and modifications will be apparent to persons skilled in the art. Such variations and modifications may involve equivalent and other features which are already known in the design, manufacture and use of semiconductor memories (both monolithic and thin-film) and of electronic devices comprising TFTs and other semiconductor devices and component parts thereof and which may be used instead of or in addition to features already described herein.

I claim:

1. A semiconductor memory comprising a plurality of memory cells each including a load driven by a non-volatile memory transistor, the memory transistor having a conduction channel which is conductive in a first memory state of the memory transistor and which is less conductive in a second memory state of the memory transistor so as to provide a difference in signal at a node between the memory transistor and the load, characterized in that each cell further comprises a switch having a control electrode coupled to the node and switched from one output state to another by the signal at the node, and in that the output state of the switch provides an output signal from the cell.

2. A semiconductor memory as claimed in claim 1, further characterized in that the switch in each cell comprises an output transistor having a control electrode coupled to the node between the memory transistor and the load.

3. A semiconductor memory as claimed in claim 2, further characterized in that the output transistor is a field-effect transistor having a gate electrode coupled to the node, and in that the memory cell comprises first and second supply lines, a read/write line and an output line, the memory transistor and its load are connected between the first and second supply lines, source electrodes of the memory transistor and of the output transistor are coupled to the first supply line, a gate electrode of the memory transistor is coupled to the read/write line, and a drain electrode of the output transistor is coupled to the output line of the cell.

4. A semiconductor memory as claimed in claim 2, further characterized in that the memory transistor and output transistor are thin-film field-effect transistors.

5. A semiconductor memory as claimed in claim 4, further characterized in that the output transistor is an enhancement field-effect transistor, and the memory transistor and output transistor are n-channel field-effect transistors.

6. A semiconductor memory as claimed in claim 1, further characterized in that the memory transistor comprises a charge storage region in a gate dielectric between a gate electrode and the conduction channel, and in that the charge state of the charge storage region determines the memory state of the memory transistor.

7. A semiconductor memory as claimed in claim 6, further characterized in that the memory transistor comprises two different dielectric layers between the gate electrode and the conduction channel, and in that the charge storage region is present between the two dielectric layers.

8. A semiconductor memory as claimed in claim 1, further characterized in that the load is an enhancement field-effect transistor having gate and drain electrodes coupled to a power supply line and a source electrode coupled to a drain electrode of the memory transistor via the node.

9. A semiconductor memory as claimed in claim 1, further characterized in that the load is a depletion field-effect transistor having a drain electrode coupled to a power supply line and having gate and source electrodes coupled to a drain electrode of the memory transistor via the node.

10. A semiconductor memory as claimed in claim 1, further characterized in that the memory is formed in thin-film circuitry on an insulating substrate as part of a larger area electronic device which also comprises other thin-film circuitry on the insulating substrate.

* * * * *